United States Patent
Wang et al.

(10) Patent No.: US 7,291,924 B2
(45) Date of Patent: Nov. 6, 2007

(54) FLIP CHIP STACKED PACKAGE

(75) Inventors: Sung-Fei Wang, Kaohsiung (TW); Ming-Lun Ho, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 4 days.

(21) Appl. No.: 10/901,038

(22) Filed: Jul. 29, 2004

(65) Prior Publication Data

US 2005/0046040 A1    Mar. 3, 2005

(30) Foreign Application Priority Data

Aug. 25, 2003   (TW) ............................. 92123337 A

(51) Int. Cl.
  *H01L 23/48*   (2006.01)
  *H01L 23/52*   (2006.01)
  *H01L 29/40*   (2006.01)

(52) U.S. Cl. ................ 257/777; 257/686; 257/723; 257/E25.031; 257/E23.042

(58) Field of Classification Search ............... 257/685, 257/686, 778, 723, 777, 784, 786, 773, 712, 257/675, 787, E25.031, E25.032, E23.042, 257/E25.006, E25.013, E25.018, E25.021, 257/E25.027, E23.085, E21.614
See application file for complete search history.

(56) References Cited

U.S. PATENT DOCUMENTS

| 5,925,930 | A * | 7/1999 | Farnworth et al. | 257/737 |
| 6,326,696 | B1 * | 12/2001 | Horton et al. | 257/777 |
| 6,469,395 | B1 * | 10/2002 | Nishihara et al. | 257/781 |
| 6,537,848 | B2 * | 3/2003 | Camenforte et al. | 438/106 |
| 6,906,415 | B2 * | 6/2005 | Jiang et al. | 257/723 |
| 6,921,968 | B2 * | 7/2005 | Chung | 257/686 |

* cited by examiner

*Primary Examiner*—Hoai V Pham
*Assistant Examiner*—DiLinh Nguyen
(74) *Attorney, Agent, or Firm*—Bacon & Thomas, PLLC

(57) ABSTRACT

A flip chip stacked package mainly comprises a carrier, a lower chip, an upper chip, a plurality of bumps, a plurality of bonding wires and a supporter. The supporter is attached to the lower surface of the carrier via an adhesive and covers the opening of the carrier. Thus, the lower chip can be disposed in the opening. In addition, the lower chip is electrically flip-chip bonded to the upper chip via the bumps and electrically connected to the carrier via the bonding wires. Accordingly, the heat generated from the lower chip can be transmitted to outside via the supporter. Furthermore, the upper chip is directly exposed to outside so that the capability of the heat dissipation will be enhanced.

21 Claims, 2 Drawing Sheets

FLIP CHIP STACKED PACKAGE

BACKGROUND OF THE INVENTION

1. Field of Invention

This invention relates to a flip chip stacked package. More particularly, the present invention is related to a flip chip stacked package with the enhanced capability of heat dissipation so as to upgrade the thermal performance of said package.

2. Related Art

In this information explosion age, integrated circuits products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages have been developed. Flip chip is one of the most commonly used techniques for forming an integrated circuits package. Moreover, compared with a wire-bonding package or a tape automated bonding (TAB) package, a flip-chip package has a shorter electrical path on average and has a better overall electrical performance. In a flip-chip package, the bonding pads on a die and the contacts on a substrate are connected together through a plurality of bumps. Accordingly, the technology of flip-chip bonding process becomes more and more important in the advanced packaging fields.

Due to the assembly package in miniature and the integrated circuits operation in high frequency, MCM (multi-chips module) packages are commonly used in said assembly packages and electronic devices. Usually, said MCM package mainly comprises at least two chips encapsulated therein, for example a processor unit, a memory unit and related logic units, so as to upgrade the electrical performance of said assembly package. In addition, the electrical paths between the chips in said MCM package are short so as to reduce the signal delay and save the reading and writing time.

Generally speaking, a conventional MCM package shall be a multi-chips side-by-side package, a multi-chips stacked package or a flip chip stacked package. As shown in FIG. 1, it illustrates a flip chip stacked package. Therein, the flip chip stacked package mainly comprises a lower chip 110, an upper chip 120, a plurality of bonding wires 130 and a plurality of bumps 140. The lower chip 110 is disposed onto a substrate 150; and the upper chip 120 is disposed above the lower chip 110 and attached thereto through the bumps 140, such as solder bumps or gold bumps, so as to be electrically connected to the lower chip 110. In addition, the upper chip 120 is electrically connected to the substrate 150 through the bonding wires 130, such as gold wires and electrically conductive wires. Moreover, there is an encapsulation 160, such as molding compound, encapsulating the upper chip 110, the lower chip 120, the bonding wires 130, the bumps 140 and the substrate 150 through molding and curing processes. Furthermore, there are solder balls 170 formed and attached onto another surface opposed to the surface carrying the lower chip 110 to transmit electrical signals from the lower chip 110 and the upper chip 120 to external electronic devices.

Besides, another flip chip stacked package is provided as shown in FIG. 2. Said package as shown in FIG. 2 mainly comprises a lower chip 210, an upper chip 220, a plurality of bonding wires 230 and a plurality of bumps 240. The lower chip 210 is disposed above the substrate 250 and attached thereto through the bumps 240, such as solder bumps, to be electrically connected to the substrate 250. The upper chip 220 is disposed above the lower chip 210 and electrically connected to the substrate 250 through the bonding wires 230, such as gold wires and electrically conductive wires. In addition, there is also an encapsulation 260, such as molding compound, encapsulating the lower chip 210, the upper chip 220, the bonding wires 230, the bumps 240 and the substrate 250 through molding and curing processes. Besides, there are solder balls 270 formed and attached onto another surface opposed to the surface carrying the lower chip 210 to transmit electrical signals to external electronic devices.

The flip chip stacked package as mentioned above can make two chips encapsulated in one assembly package, however, the heat of the upper chip and the lower chip are transmitted to outside through the bonding wires or the bumps. Accordingly, said heat is not directly transmitted to the outside and the thermal performance of the package is not good. Moreover, the lower chip is usually designed with a larger size. Accordingly, there is usually needed a larger substrate to accommodate the lower chip well and provide enough space for wire-bonding said wires to connect the substrate and the upper chip or for flip chip bonding to flip-chip bond the lower chip to the substrate. Thus, the package will become larger in size.

Therefore, providing another flip chip stacked package or assembly package to solve the mentioned-above disadvantages is the most important task in this invention.

SUMMARY OF THE INVENTION

In view of the above-mentioned problems, the invention is to provide a flip chip stacked package with the enhanced capability of heat dissipation so as to upgrade the thermal performance of said package.

To achieve the above-mentioned, a flip chip stacked package is provided, wherein the flip chip stacked package mainly comprises a carrier, such as a substrate, an upper chip, a lower chip, a plurality of bumps, a plurality of bonding wires, and a supporter. Therein, the carrier has an opening; and the supporter is disposed under the opening and attached to the carrier through an adhesive so as to cover the opening. Besides, the lower chip is disposed above the supporter and the upper chip is attached to the lower chip through the bumps. In addition, each bump has a adequate height so as to have the upper chip wire bonding to the substrate well through the bonding wires. Moreover, when the lower chip is smaller than the upper chip in size, there is also provided a dam interposed between the upper chip and the substrate to prevent the upper chip from being tilt. In such a manner, it will prevent the upper chip from being not mounted to the lower chip well.

In summary, this invention is related to a flip chip stacked package which may cause the heat generated from the lower chip to be dissipated to the outside through the supporter. Furthermore, the upper chip of said package is exposed out to the outside directly, so the thermal performance of said package will be enhanced and improve the disadvantage of the conventional flip chip stacked package. Moreover, the lower chip is accommodated in the opening so as to make the overall thickness of the package smaller and smaller.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The flip chip stacked package according to the preferred embodiments of this invention will be described herein below with reference to the accompanying drawings, wherein the same reference numbers refer to the same elements.

Figure 1:
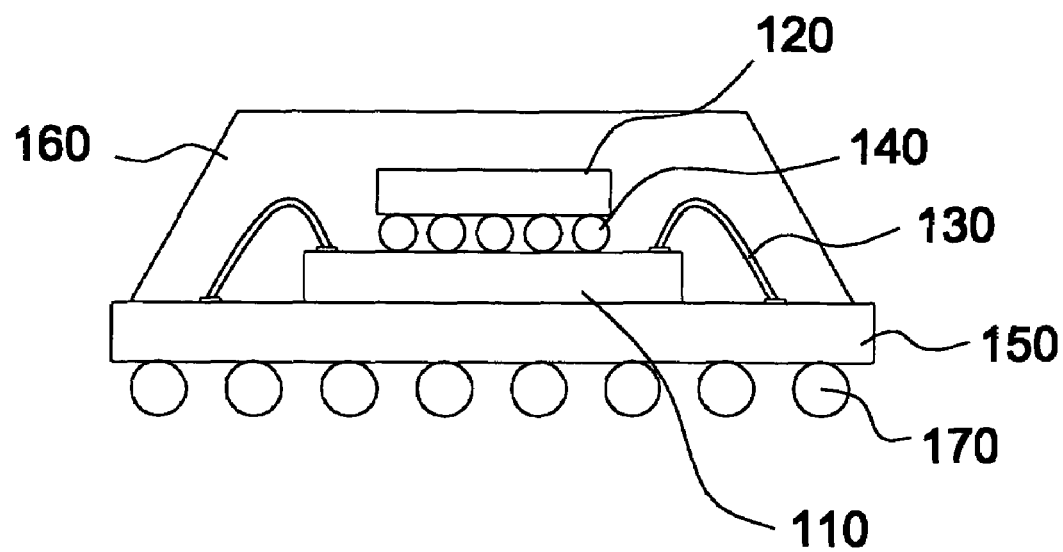
FIG. 1 is a cross-sectional view of the conventional flip chip stacked package.
Figure 2:
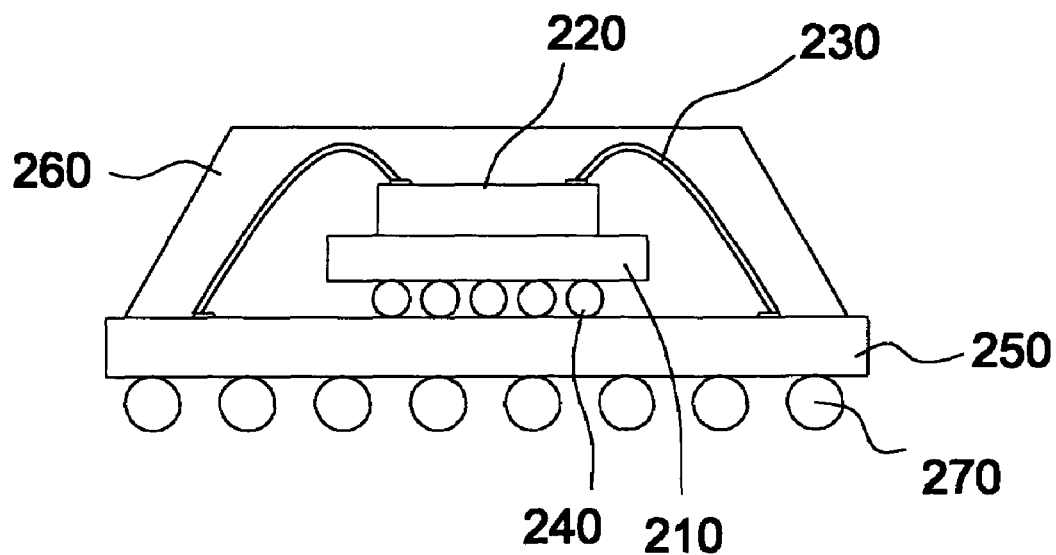
FIG. 2 is a cross-sectional view of another conventional flip chip stacked package.
Figure 3:
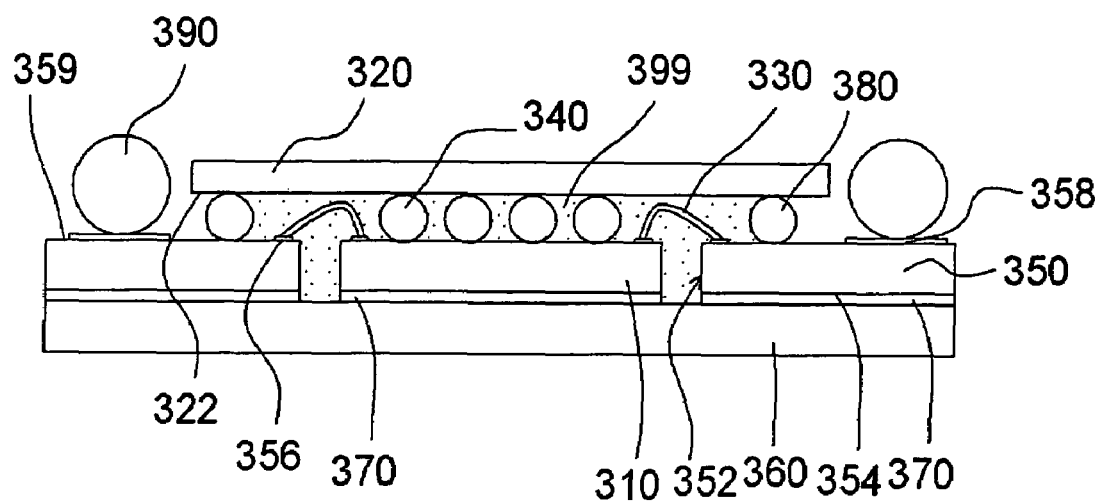
FIG. 3 is a cross-sectional view of a flip chip stacked package according to the first embodiment.

In accordance with a first preferred embodiment as shown in FIG. 3, there is provided a flip chip stacked package. The flip chip stacked package mainly comprises a lower chip 310, an upper chip 320, a plurality of bonding wires 330, a plurality of bumps 340, a carrier 350 and a supporter 360. Therein, the supporter 360 is disposed below the opening 352 of the carrier 350 and attached to the lower surface 354 of the carrier 350 through an adhesive 370 so as to carry the lower chip 310 and have the lower chip 310 accommodated in the opening 352. Besides, the lower chip 310 is electrically connected to the upper chip 320 through the bumps 340 so as to have the lower chip 310 flip-chip bonded to the upper chip 320. Moreover, each of the bumps 340 has a height to provide a suitable gap to have the lower chip 310 electrically connected to the contacts 356 located at the periphery of the opening 352 through the bonding wires 330.

In addition, generally speaking, the lower chip 310 is smaller than the upper chip 320 in size, so there is provided a dam 380 between the upper chip 320 and the carrier 350 to prevent the upper chip 320 from being titled. In such a manner, the attachment of the upper chip 320 to the lower chip 310 will become better. To be noted, the dam 380 is located between the periphery of the opening 352 and the contacts 358.

As shown above, because the bumps 340 and the dam 380 are able to define a gap, the top of the arc of the one of the bonding wires 330 is lower than the active surface 322 of the upper chip 320. Thus, the bonding wires 330 will be prevented from being damaged due to the contact with the active surface 322.

Besides, as mentioned above, the supporter 360 entirely covers the lower surface 354 of the carrier 350 and there are solder balls 390 attached to the upper surface 359 of the carrier 350 for electrically connecting to external electronic devices.

Figure 4:
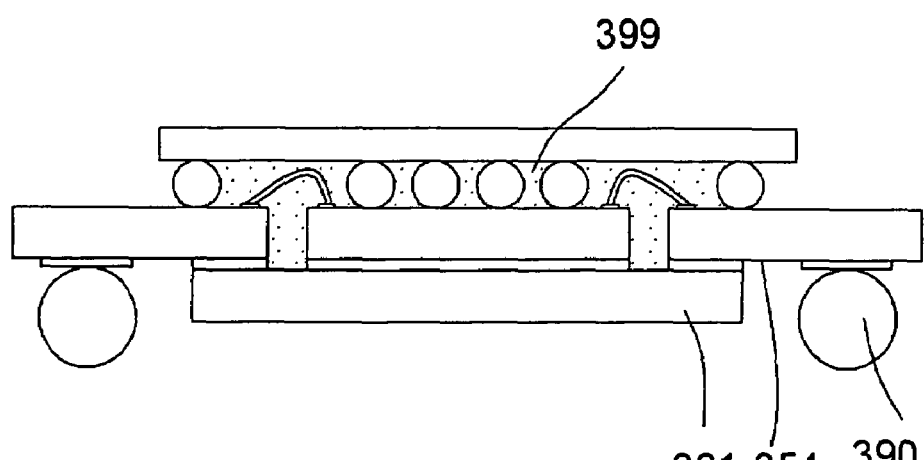
FIG. 4 is a cross-sectional view of a flip chips stacked package according to the second embodiment.

Next, referring to FIG. 4, there is provided a second preferred embodiment. What is the difference of the second embodiment from the first embodiment is that the supporter 361 is disposed below the carrier 350 and partially covers the lower surface 354 of the carrier 350. In such a manner, the solder balls 390 are able to be attached to the lower surface 354 of the carrier 350, which is not covered by the supporter 361.

As mentioned above, the supporter may be a metal plate, such as a copper metal plate with a great coefficient of thermal efficiency, so as to enhance the thermal performance of the package. However, the dummy chip can be also elected as the supporter. No matter the material of the supporter is made, the area of the supporter can be the substantially the same as the carrier so as to increase the area for dissipating the heat generated from the lower chip.

Besides, the dam 380 is made of a material selected from one with larger young's module. Namely, the dam 380 is made of a material selected from metal and epoxy with great stiffness, such as copper bumps, solder bumps, solder balls, copper balls, B-stage epoxy. Because said dam 380 as mentioned above, is able to control the height of the bumps 340 after the bumps 340 connect the lower chip 310 and the upper chip 320 and the reflow process is preformed. In such a manner, the bonding wires 330 can be prevented from being damaged due to the contact with the active surface 322 of the upper chip 320.

Moreover, the lower chip 310 and the upper chip 320 are flip-chip bonded with each other and the upper chip 320 is attached and mounted to the carrier 350, there is usually larger stress at the dam 380 and the bumps 340 when the working temperature is change. Accordingly, as shown in FIGS. 3 and 4. there is needed to provide an underfill 399 filled in the opening 352 and encapsulating the lower chip 310, the upper chip 320, the bonding wires 330, the bumps 340 and the dam 380 to release the stress at the bumps 340 and the dam 380.

Although the invention has been described in considerable detail with reference to certain preferred embodiments, it will be appreciated and understood that various changes and modifications may be made without departing from the spirit and scope of the invention as defined in the appended claims.

What is claimed is:

1. A flip chip stacked package, comprising:
  a carrier having an upper surface, a lower surface and an opening passing through the upper surface and the lower surface;
  a heat dissipation supporter disposed below the surface of the carrier and covering the opening;
  a lower chip disposed above the supporter and accommodated in the opening;
  a plurality of bonding wires electrically connected to the lower chip and the carrier;
  an upper chip having an active surface facing the lower chip, wherein the lower chip is smaller than the upper chip in size, and the upper chip covers the opening;
  a plurality of bumps electrically connected to the upper chip and the lower chip, wherein the bumps form a gap between the active surface of the upper chip and the lower chip to prevent the bonding wires from contacting the active surface of the upper chip; and
  an adhesive interposed between the lower chip and the heat dissipation supporter and the carrier and the heat dissipation supporter, wherein the heat dissipation supporter is not electrically connected to the lower chip and the carrier.

2. The flip chip stacked package of claim 1, further comprising a plurality of dams located at the periphery of the opening and connecting the upper chip and the carrier.

3. The flip chip stacked package of claim 2, wherein the carrier further comprises a plurality of contacts formed on the upper surface and located between the periphery of the opening and the dams.

4. The flip chip stacked package of claim 2, wherein the dams are made of B-stage epoxy.

5. The flip chip stacked package of claim 1, wherein the heat dissipation supporter is a metal plate.

6. The flip chip stacked package of claim 1, wherein the heat dissipation supporter is a copper plate.

7. The flip chip stacked package of claim 1, wherein the heat dissipation supporter is a silicon chip.

8. The flip chip stacked package of claim 1, wherein the heat dissipation supporter is a dummy chip.

9. The flip chip stacked package of claim 1, wherein the heat dissipation supporter entirely cover the lower surface of the carrier.

10. The flip chip stacked package of claim 9, further comprising solder balls attached on the upper surface of the carrier and not located under the upper chip.

11. The flip chip stacked package of claim 1, wherein the heat dissipation supporter partially covers the lower surface of the carrier and exposes the lower surface of the carrier.

12. The flip chip stacked package of claim 11, further comprising solder balls attached on the lower surface of the carrier.

13. The flip chip stacked package of claim 1, further comprising an underfill filled in the opening.

14. The flip chip stacked package of claim 13, wherein the underfill further encapsulates the upper chip, the lower chip, the heat dissipation supporter and the upper surface of the carrier.

15. A flip chip stacked package comprising:
a carrier having an upper surface, a lower surface and an opening passing through the upper surface and the lower surface;
a heat dissipation supporter disposed below the surface of the carrier and covering the opening;
a lower chip disposed above the supporter and accommodated in the opening;
a plurality of bonding wires electrically connected to the lower chip and the carrier;
an upper chip having an active surface facing the lower chip, wherein the lower chip is smaller than the upper chip in size, and the upper chip covers the opening;
a plurality of bumps electrically connecting the upper chip and the lower chip;
wherein the bumps form a gap between the active surface of the upper chip and the lower chip to prevent the bonding wires from contacting the active surface of the upper chip;
a plurality of dams located at the periphery of the opening and connecting the upper chip and the carrier, wherein the dams form a gap between the active surface of the upper chip and the lower chip; and
an adhesive interposed between the lower chip and the heat dissipation supporter and the carrier and the heat dissipation supporter, wherein the heat dissipation supporter is not electrically connected to the lower chip and the carrier.

16. The flip chip stacked package of claim 15, wherein the heat dissipation supporter entirely covers the lower surface of the carrier.

17. The flip chip stacked package of claim 16, further comprising a plurality of solder balls attached on the upper surface of the carrier.

18. The flip chip stacked package of claim 15, wherein the heat dissipation supporter partially covers the lower surface of the carrier and exposes the lower surface of the carrier.

19. The flip chip stacked package of claim 18, further comprising a plurality of solder balls attached on the lower surface of the carrier.

20. The flip chip stacked package of claim 15, further comprising an underfill filled in the opening.

21. The flip chip stacked package of claim 20, wherein the underfill further encapsulates the upper chip, the lower chip, the heat dissipation supporter and the upper surface of the carrier.

* * * * *